United States Patent
Blanding

(10) Patent No.: US 6,989,068 B2
(45) Date of Patent: Jan. 24, 2006

(54) ROLLER CHAIN FOR APPLYING PRESSURE

(75) Inventor: Douglass L. Blanding, Rochester, NY (US)

(73) Assignee: Eastman Kodak Company, Rochester, NY (US)

(*) Notice: Subject to any disclaimer, the term of this patent is extended or adjusted under 35 U.S.C. 154(b) by 0 days.

(21) Appl. No.: 10/831,085

(22) Filed: Apr. 23, 2004

(65) Prior Publication Data

US 2005/0236095 A1 Oct. 27, 2005

(51) Int. Cl.
*B30B 5/00* (2006.01)

(52) U.S. Cl. .................. 156/228; 156/555; 156/582; 156/583.5

(58) Field of Classification Search .............. 156/228, 156/555, 580, 581, 582, 583.1, 583.3, 583.5; 100/306, 311, 327, 151, 153, 154, 160, 176, 100/222

See application file for complete search history.

(56) References Cited

U.S. PATENT DOCUMENTS

| | | | |
|---|---|---|---|
| 3,570,340 A | * | 3/1971 | Rohdin .................... 83/55 |
| 3,570,341 A | * | 3/1971 | Abbott, Jr. ................ 83/55 |
| 4,125,045 A | * | 11/1978 | Jeremic .................... 83/389 |
| 4,744,854 A | * | 5/1988 | Schenz .................... 156/498 |
| 4,932,855 A | * | 6/1990 | Gersbeck et al. ........... 425/193 |
| 5,208,609 A | * | 5/1993 | Chung et al. .............. 347/232 |
| 5,376,220 A | * | 12/1994 | Campbell .................. 156/581 |
| 5,550,627 A | | 8/1996 | Dowler et al. |
| 5,777,650 A | | 7/1998 | Blank |
| 5,916,727 A | | 6/1999 | Camillus et al. |
| 6,390,694 B1 | | 5/2002 | Allen et al. |
| 6,463,981 B1 | | 10/2002 | Kerr |
| 6,658,230 B2 | | 12/2003 | Satoh |

* cited by examiner

*Primary Examiner*—James Sells
(74) *Attorney, Agent, or Firm*—Nelson Adrian Blish

(57) ABSTRACT

An apparatus (10) applies pressure against a platen (16) using a linked series of contact members arranged in a closed loop. A drive apparatus rotates the loop about a support mechanism, thereby imparting movement to the linked series of contact members. The support mechanism is disposed to force a plurality of the moving contact members simultaneously into compressive contact against the platen (16).

74 Claims, 13 Drawing Sheets

ROLLER CHAIN FOR APPLYING PRESSURE

FIELD OF THE INVENTION

This invention generally relates to apparatus for applying pressure onto the surface of a substrate and more particularly relates to an apparatus and method for applying pressure by moving a linked series of contact members maintained in compressive contact with a portion of the substrate that is disposed between the contact members and a platen.

BACKGROUND OF THE INVENTION

There are a number of imaging applications that require, at some stage in processing, the application of a uniform pressure onto the surface of a substrate. Conventional offset lithographic printing equipment, for example, uses applied pressure for transferring an ink colorant from a printing plate onto the print substrate. Various types of office duplicating equipment, such as xerographic copiers, use pressure from paired rollers for image transfer onto paper or other suitable substrate. Laminators, such as that used with the "KODAK APPROVAL Digital Proofing System"™ available from the Eastman Kodak Company, located in Rochester, N.Y., also require application of controlled pressure, commonly combined with heat, for transfer of an image from an intermediate medium to a paper substrate or for application of a protective coating over the substrate surface. Micro-encapsulated media, such as CYCOLOR™ print media, commercially available from Cycolor, Inc. and described in U.S. Pat. No. 5,916,727 (Camillus et al.), also require the controlled application of pressure for processing the final image from encapsulated leuco dye elements that are coated into an imaging substrate, after these elements are activated by exposure to light.

With each of these applications, conventional drum rollers apply pressure uniformly onto a surface. In operation, opposing drum rollers are forced against each other to provide, at their interface, a linear nip for pressure application. With roller rotation, the substrate moves through the nip. In practice, large drum rollers have proved to be an acceptable solution for lithographic printing and for many xerographic and other image transfer and lamination uses. As just a few examples: U.S. Pat. No. 6,658,230 (Satoh) discloses an apparatus for transferring imaging toner using paired rollers; U.S. Pat. No. 6,463,981 (Kerr) discloses the use of pressure rollers in a lamination apparatus; U.S. Pat. No. 5,777,650 (Blank) discloses a pressure roller for transferring and fixing an ink-based image onto a substrate; and U.S. Pat. No. 5,208,609 (Chung et al.) discloses the use of a pressure-roller apparatus with the Cycolor media.

However, for some applications, particularly where it is necessary to apply a substantial amount of pressure uniformly onto a substrate surface, such as when processing the Cycolor print media, there are drawbacks to the conventional use of paired rollers. Thus, for example, the paired roller solution of U.S. Pat. No. 5,208,609 may work adequately with small-format Cycolor images, but be less than satisfactory if scaled to accommodate larger images, such as 8×10 inch images. Acknowledged among the drawbacks to the use of rollers are problems due to surface imperfections, insufficient overall pressure between rollers, sag, eccentricity about axes of rotation, and non-uniform force distribution across the nip.

As an alternative to applying pressure using paired rollers, commonly-assigned U.S. Pat. No. 6,390,694 (Allen et al.) discloses a pressure assembly that oscillates a point contact mechanism over the substrate surface in raster fashion. In a similar spirit, U.S. Pat. No. 5,550,627 (Dowler et al.), noting the above-cited problems with conventional roller use for microencapsulated media processing, discloses a combined exposure and pressure applicator head that oscillates over the substrate, where the pressure applicator portion drives a small number of contact points along the surface in a raster pattern, thereby providing a more uniform pressure. The solution of U.S. Pat. Nos. 6,390,694 and 5,550,627 may yield a suitable image output, provided that mechanical tolerances are highly accurate. However, the slow speed of the oscillating point-contact approach makes this approach commercially unattractive. The deployment of multiple contact points scanned simultaneously, as is used in U.S. Pat. No. 5,550,627, may help to reduce the overall processing time somewhat. Even this solution, however, does not boost throughput speed sufficiently for commercialization.

For Cycolor media processing and for other types of apparatus used for forming images, intense localized pressure must be uniformly applied over the surface of a substrate. However, prior art approaches have not yet provided a robust, low cost solution to the problem of applying, onto a sheet of substrate having a range of possible dimensions, sufficient pressure with the needed level of uniformity and with the processing speed needed for imaging applications. Thus, it can be seen that there is a need for an apparatus and method for uniformly applying pressure onto a substrate.

SUMMARY OF THE INVENTION

It is an object of the present invention to meet the requirements for a pressure application apparatus that provides a uniform pressure onto a substrate. With this object in mind, the present invention provides an apparatus for applying pressure against a platen, comprising:

a linked series of contact members arranged in a closed loop;

a drive apparatus for rotating the loop about a support mechanism, thereby imparting movement to the linked series of contact members; and the support mechanism disposed to force a plurality of the moving contact members simultaneously into compressive contact against at least a portion of the platen.

It is a feature of the present invention that it directs pressure uniformly against a platen by means of a moving series of contact members, wherein the combined action of these contact members, providing pressure only onto a relatively small area at any instant, provides a uniform pressure onto the full surface area over time.

It is an advantage of the present invention that it is suitable for processing a substrate that is held against a rotatable drum or against a movable flat platen.

It is an advantage of the present invention that, when used in combination with a rotatable drum, the apparatus of the present invention can be configured both to provide pressure and to provide torque that causes drum rotation at a suitable speed for substrate processing.

It is an advantage of the present invention that it provides improved pressure uniformity, even where the underlying platen may have some amount of surface irregularity.

It is a further advantage of the present invention that it provides a scalable solution that can be appropriately sized for handling a range of different substrate sizes.

It is a further advantage of the apparatus of the present invention that it is capable of providing a high degree of crushing pressure against a substrate. A comparable pressure roller system of conventional design would require that considerable force be maintained between pressure rollers, and that highly accurate mechanical tolerances be maintained throughout pressure application, in order to achieve similarly high levels of crushing pressure in a uniform manner.

These and other objects, features, and advantages of the present invention will become apparent to those skilled in the art upon a reading of the following detailed description when taken in conjunction with the drawings wherein there is shown and described an illustrative embodiment of the invention.

BRIEF DESCRIPTION OF THE DRAWINGS

While the specification concludes with claims particularly pointing out and distinctly claiming the subject matter of the present invention, it is believed that the invention will be better understood from the following description when taken in conjunction with the accompanying drawings, wherein:

DETAILED DESCRIPTION OF THE INVENTION

The present description is directed in particular to elements forming part of, or cooperating more directly with, apparatus in accordance with the invention. It is to be understood that elements not specifically shown or described may take various forms well known to those skilled in the art.

Figure 1A:
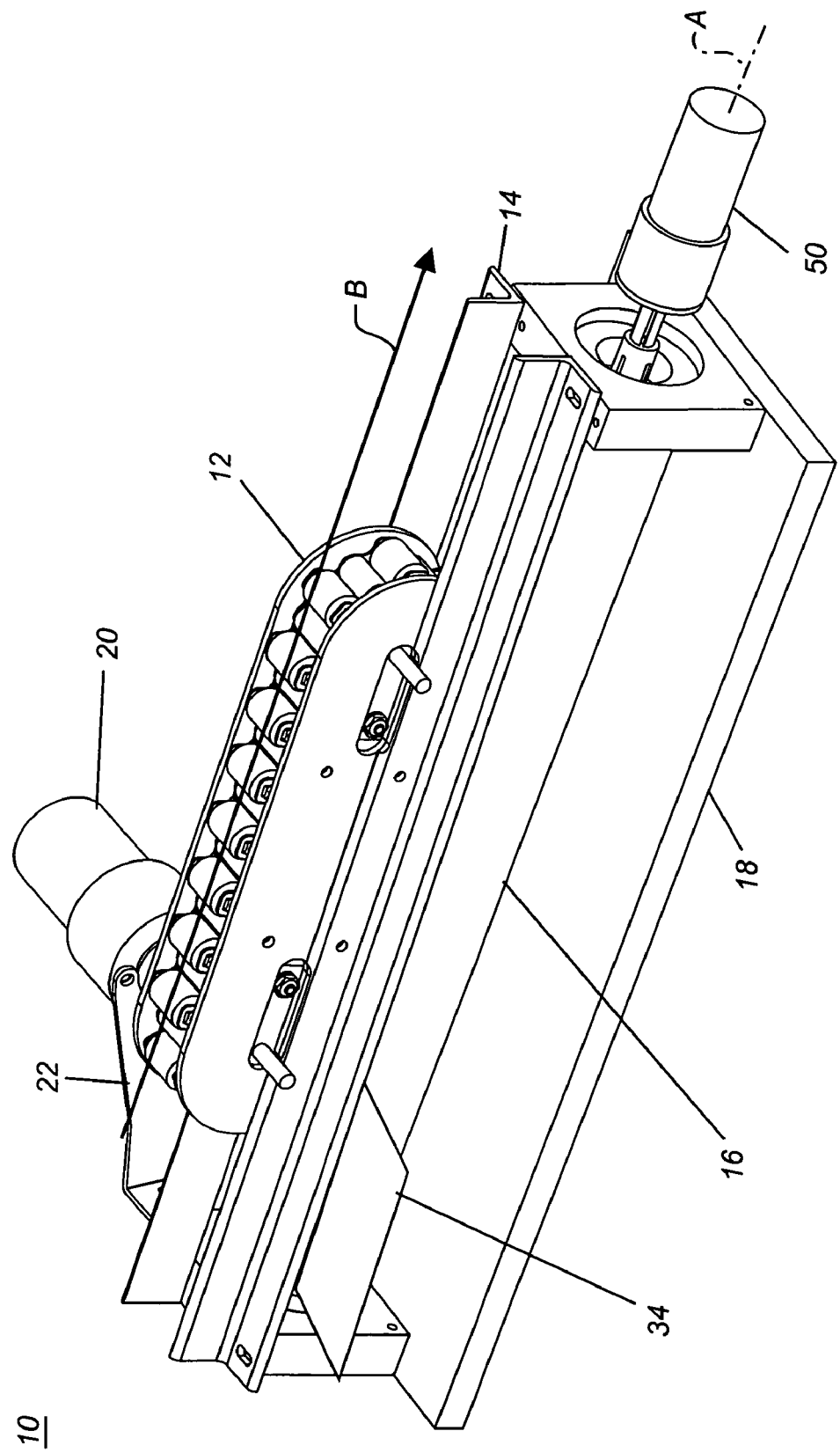
FIGS. 1a and 1b are perspective views of embodiments of a pressure application apparatus according to the present invention.

Referring to FIG. 1a, there is shown a perspective view of a pressure application apparatus 10 according to one embodiment of the present invention. Arranged in a closed loop, a chained roller assembly 12, held by a mounting bracket 14, is pressed against a platen 16. In the configuration of FIG. 1a, platen 16 is a rotatable drum mounted in a base 18 and rotated by a motor 50. However, other types of platen 16 could be employed, including a flat platen, as is described subsequently. In operation, a sheet 34 of substrate may be wrapped about the rotatable drum of base 18 for processing or may simply be fed between chained roller assembly 12 and platen 16. While motor 50 rotates platen 16, a second motor 20, mounted with a stabilizing motor bracket 22, provides rotational motion along a direction B for chained roller assembly 12. Here, direction B is parallel to the axis A of cylindrical platen 16. With motors 20 and 50 in operation, sheet 34 on platen 16 travels beneath chained roller assembly 12, thereby applying pressure, over time, onto the full surface area of sheet 34.

Figure 1B:
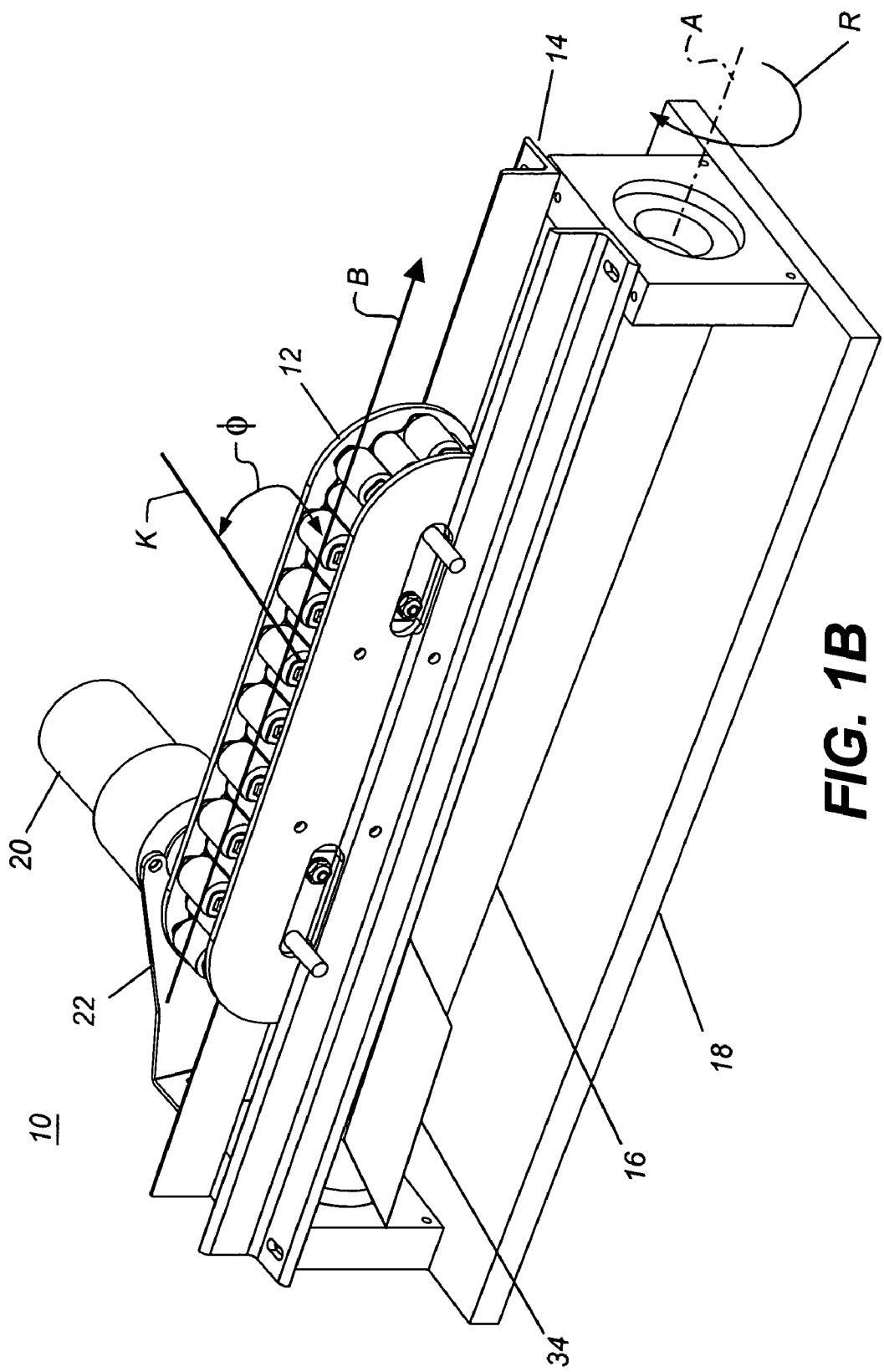

Referring to FIG. 1b, an alternate embodiment of pressure application apparatus 10 is shown. Here, second motor 50 is not needed. Instead, as is somewhat exaggerated in the perspective view of FIG. 1b, chained roller assembly 12 is mounted at a skewed angle, slightly offset relative to the drum axis A, so that direction B and axis A are not parallel. This arrangement allows chained roller assembly 12 to provide pressure against platen 16 and, at the same time as it rotates in direction B, to provide force causing rotational movement, in the R direction, of the rotatable drum that serves as platen 16.

Figure 1C:
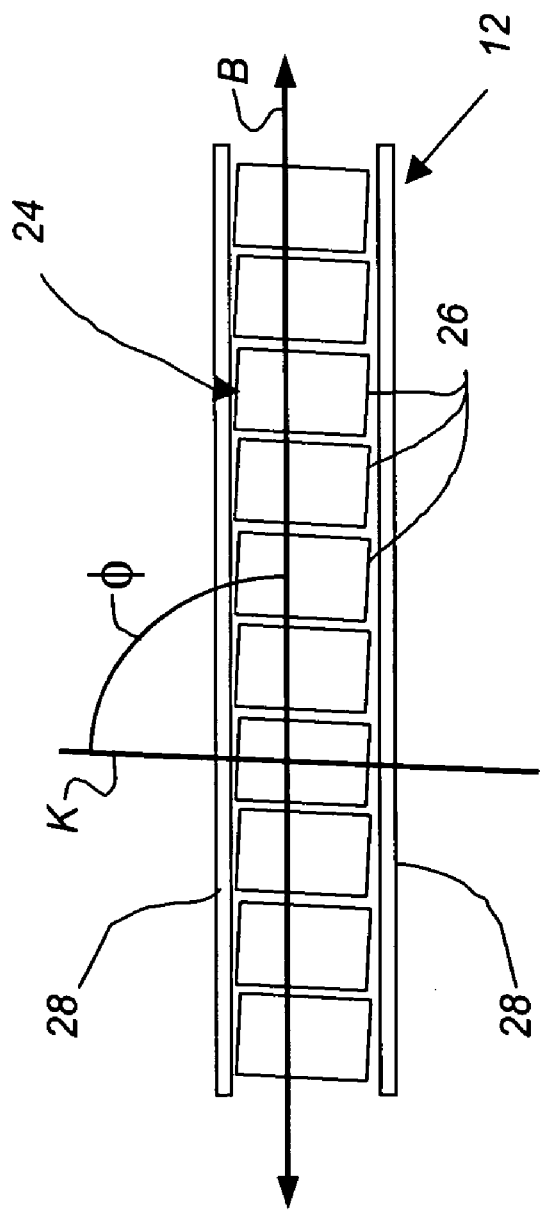
FIG. 1c is a top view showing the arrangement of a chained roller assembly with skewed link components in an alternate embodiment.

The top view of FIG. 1c shows yet another embodiment using a skewed angle for chained roller assembly 12 components themselves. With this arrangement, each link component 26 of a linked roller chain 24 is deployed at a slight skew K relative to rotation direction B. With reference to FIG. 1c, angle φ between skew K and direction B is other than 90 degrees. Skew K results in additional force being applied during rotation of linked roller chain 12, capable of causing rotational movement, in the R direction (FIG. 1b), of the rotatable drum that serves as platen 16. In one embodiment, direction B would be substantially parallel with axis A using the configuration of FIG. 1c. A combination using both a skewed direction B relative to axis A and skew K relative to direction B could also be used.

Figure 2:
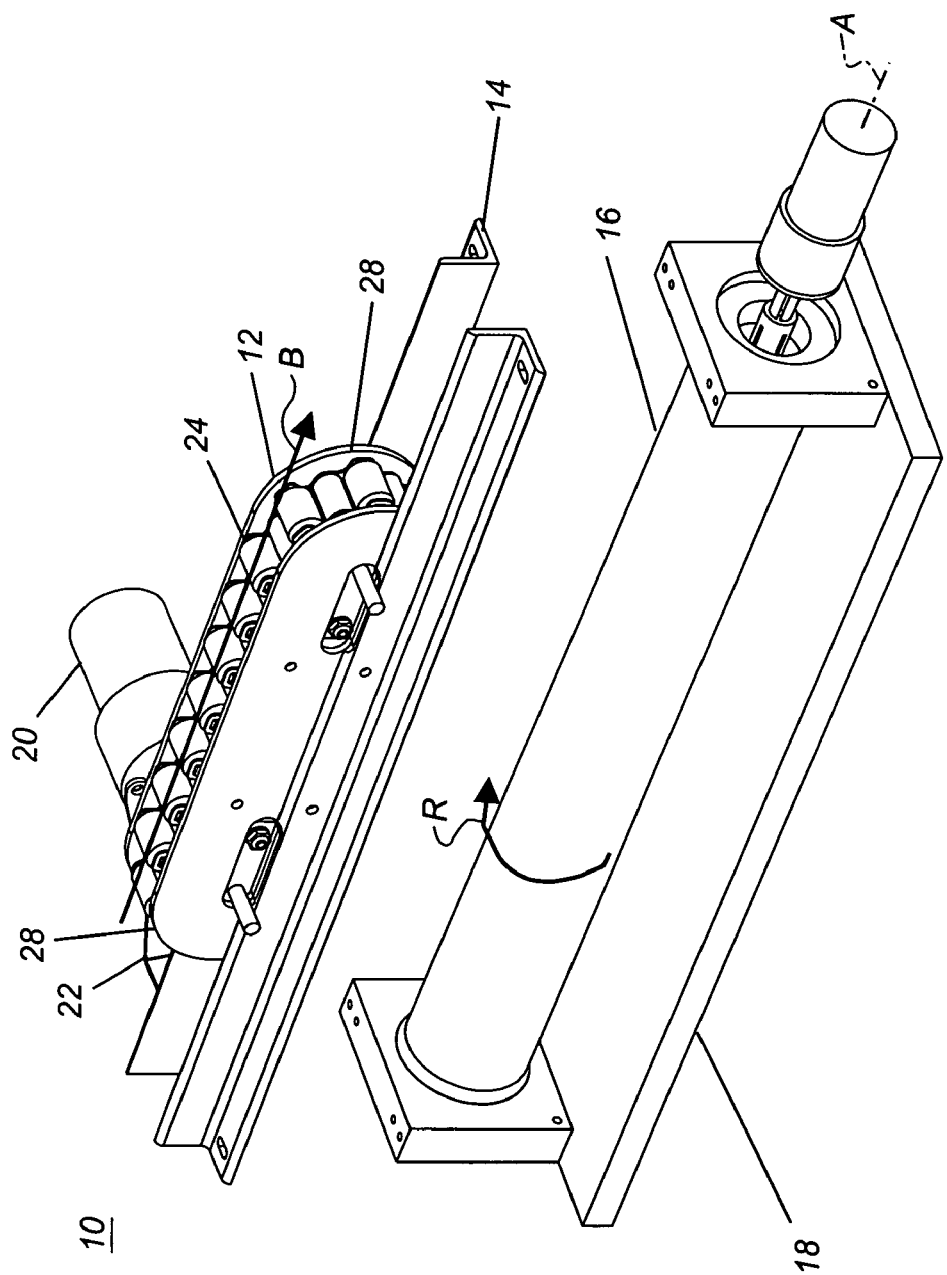
FIG. 2 is an exploded view showing a chained roller assembly of the present invention in relationship with a revolving drum.

Referring to FIG. 2, there is shown an exploded view, with mounting bracket 14 disconnected from base 18 for better visibility of the component parts of pressure application apparatus 10. When motor 20 is energized, its rotational motion causes corresponding rotation of linked roller chain 24 around the perimeter of chained roller assembly 12, in similar fashion to the familiar transmission chain used in a bicycle or other apparatus. Linked roller chain 24 rotates in direction B, so that the lower span of linked roller chain 24 travels in rolling contact with platen 16.

Figure 3:
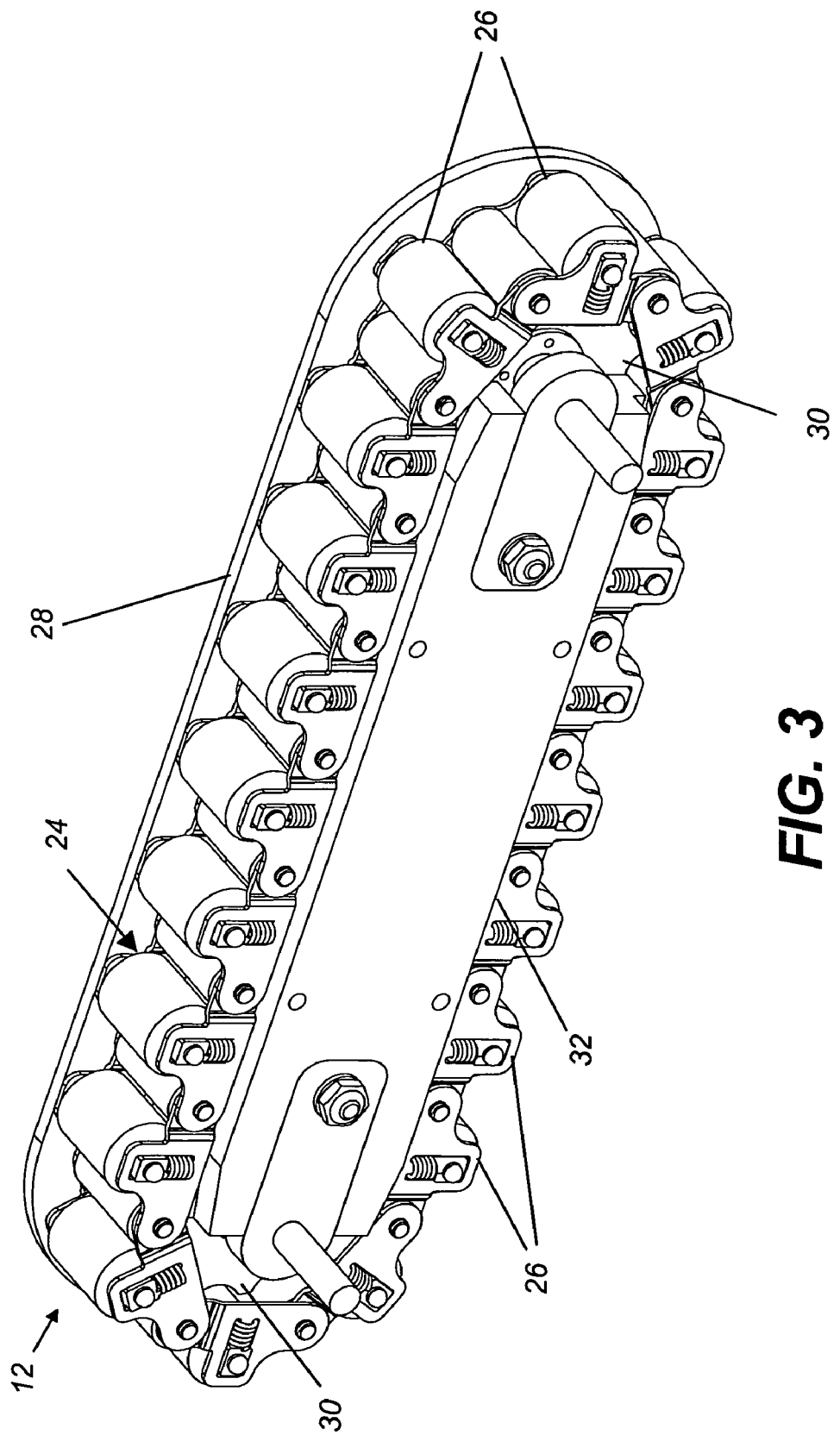
FIG. 3 is a perspective view showing a chained roller assembly with one lateral guide plate removed.

Referring to FIG. 3, there is shown a perspective view of chained roller assembly 12, partially disassembled to show its structure. As is shown in FIGS. 1c and 2, two guide plates 28 are provided, one on each flat side of a support member 32, for maintaining linked roller chain 24 on its intended axis (that is, rotating in direction B as is shown with respect to FIGS. 1a, 1b, 1c, and 2). For clarity, only one guide plate 28 is shown in FIG. 3; the other guide plate 28 is removed to allow visibility of chained roller assembly 12 components. A support member 32 has two sprockets 30 for providing movement to rotate linked roller chain 24. Linked roller chain 24 comprises a plurality of link components 26 that travel along top and bottom surfaces of support member 32.

Figure 4:
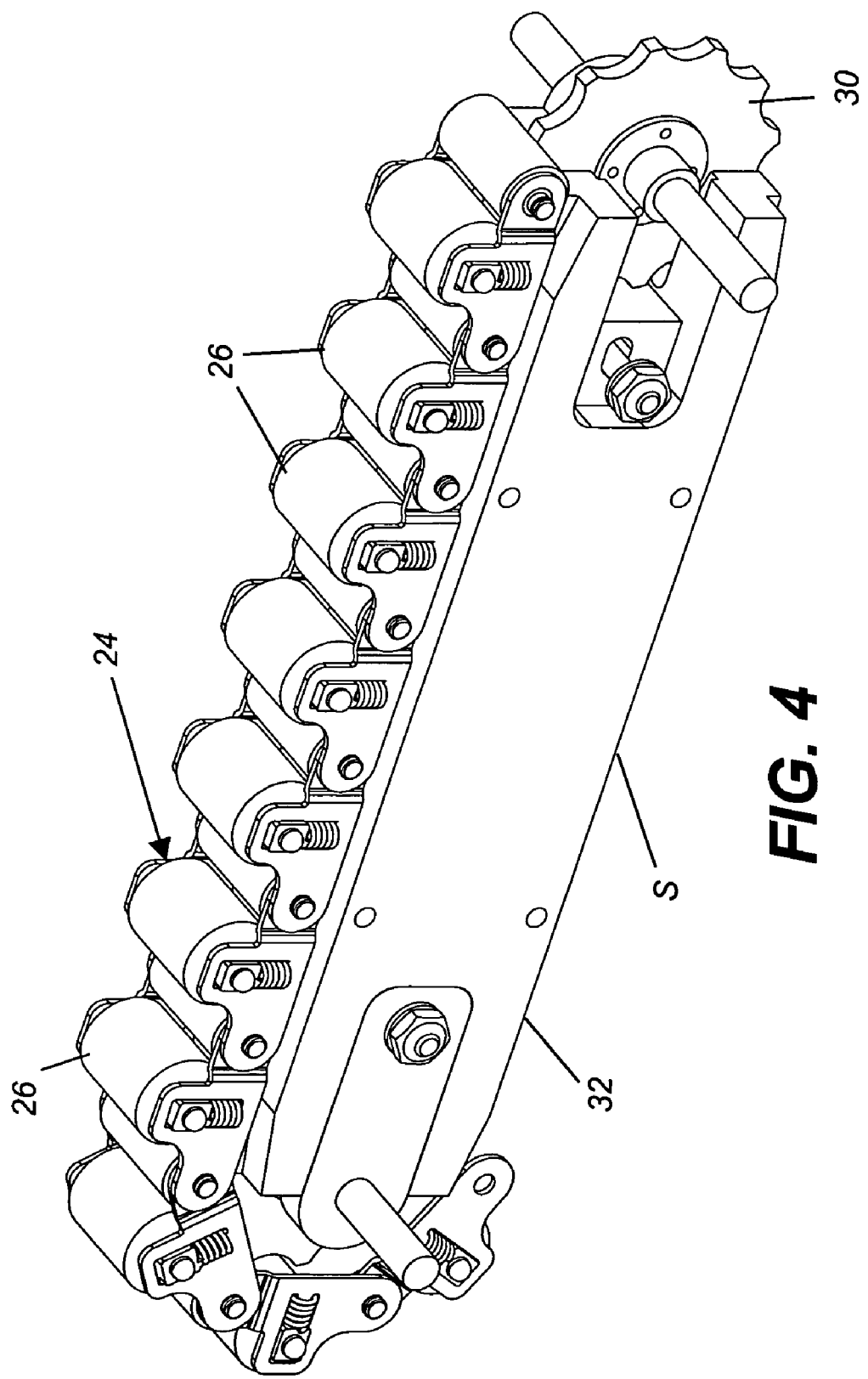
FIG. 4 is a perspective view showing a portion of the roller chain in position against the main support member.
Figure 5:
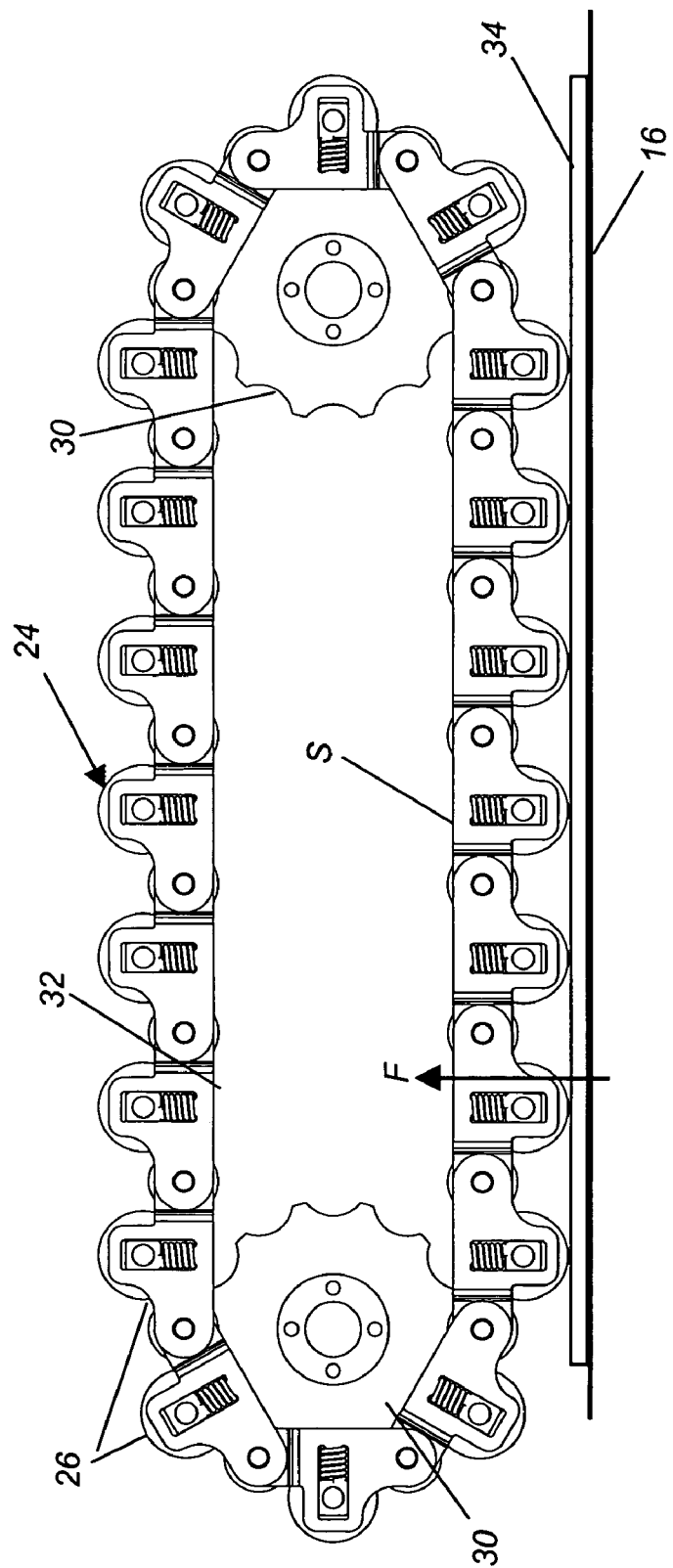
FIG. 5 is a side view showing the mechanical relationship of the roller chain with sprockets in the main support member.

Referring to FIG. 4, there is shown support member 32 with only a portion of linked roller chain 24 mounted thereon. Sprockets 30 are partially visible in this view. As is shown in the side view of FIG. 5, compressive contact onto platen 16 is maintained by a spring force F against a facing surface S of support member 32. FIG. 5 shows the arrangement of linked roller chain 24 between sprockets 30, providing a mechanism for applying pressure, in a series of small contact areas that are continuously shifted in position over substrate sheet 34 as linked roller chain 24 rotates.

Figure 6:
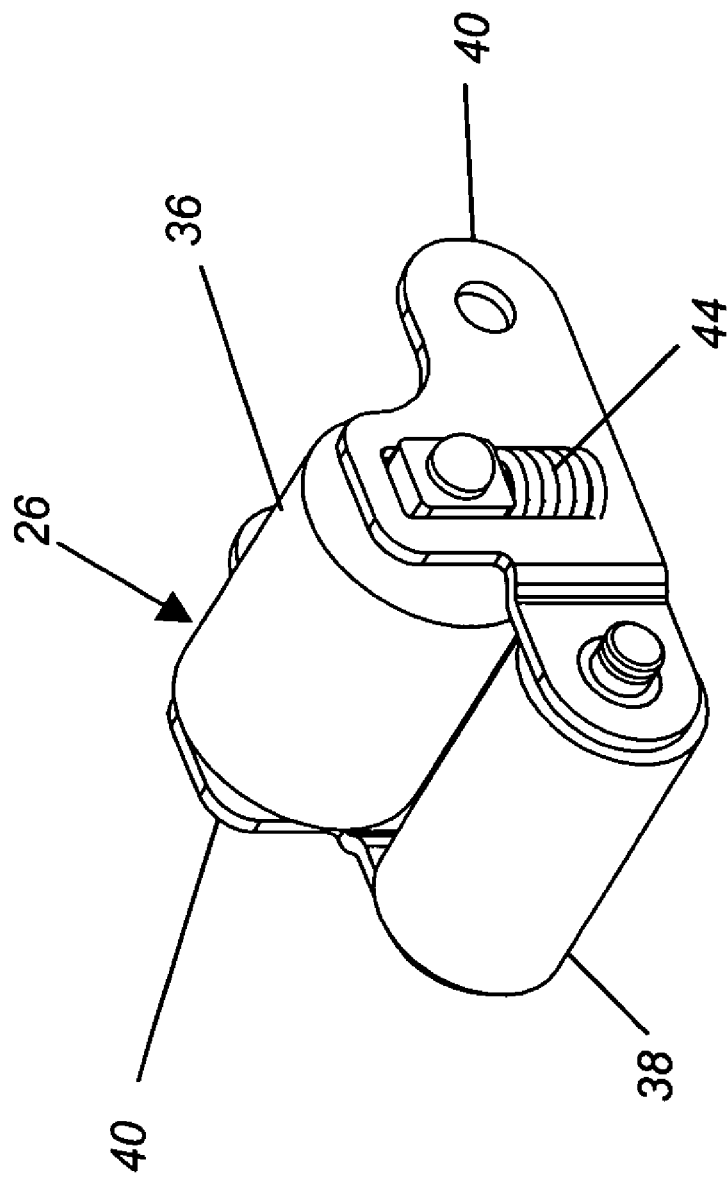
FIG. 6 is a perspective view of a single roller link.
Figure 7:
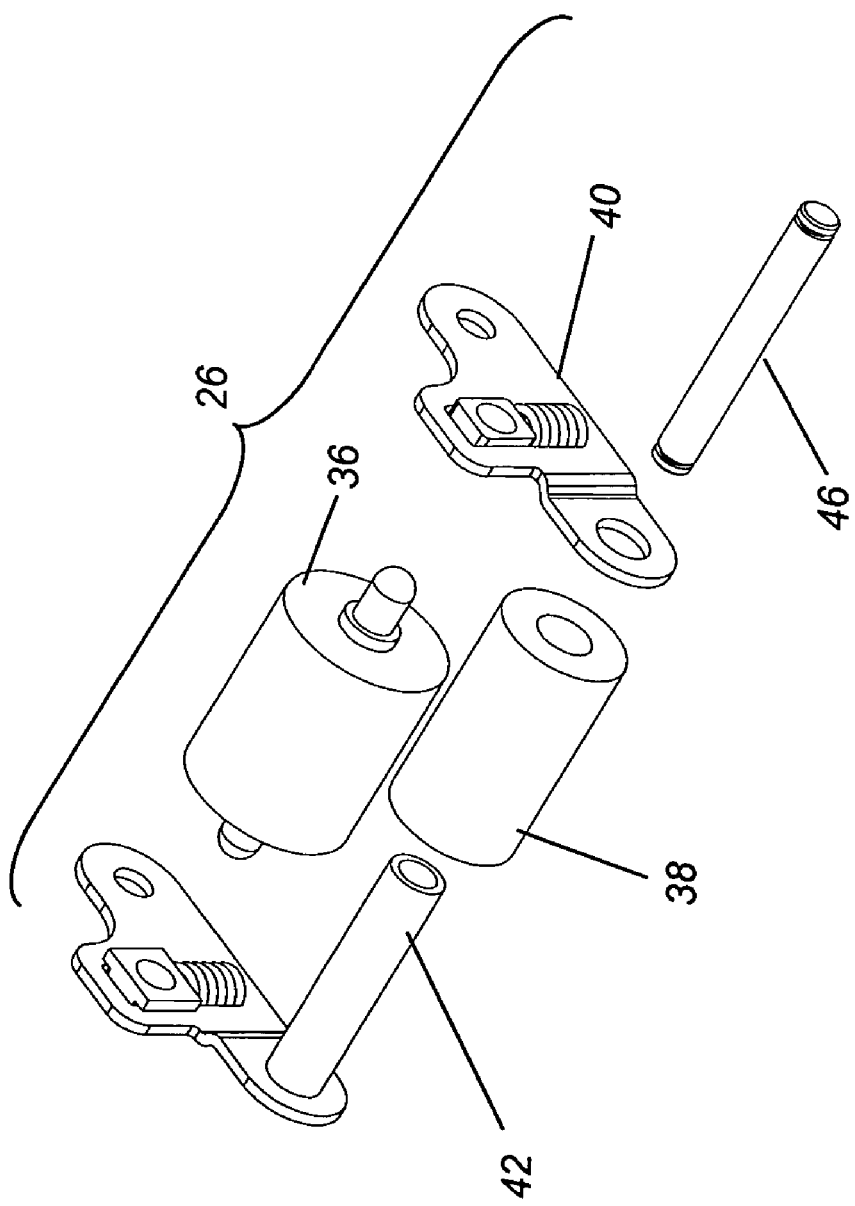
FIG. 7 is a partially exploded view showing components of the roller link of FIG. 6.

Referring to FIGS. 6 and 7, there are shown assembled and partially exploded perspective views, respectively, of link component 26 for this first embodiment. A contact roller 36 serves as a contact member. Contact roller 36 is fitted into a spring mounted bearing 44 and provides a contact surface that, in operation, is pressed against substrate sheet 34. Substrate sheet 34 is fitted between contact roller 36 and platen 16 (shown as a drum in FIGS. 1a, 1b, and 2). Two side plates 40 provide a support housing for contact roller 36 and for a transmission roller 38 that cooperates with sprockets 30 to obtain motive force from sprocket 30 rotation, using methods well known in the mechanical arts. As is shown in the exploded view of FIG. 7, transmission roller 38 rides on a bushing 42. A pin 46 through bushing 42 provides the connector for joining each successive link component 26 to the next. Because it provides the contact surface, contact roller 36 is fabricated of some suitable metal, such as steel. Transmission roller 38 can be metal or a durable synthetic material, such as Teflon or nylon, for example.

Figure 8:
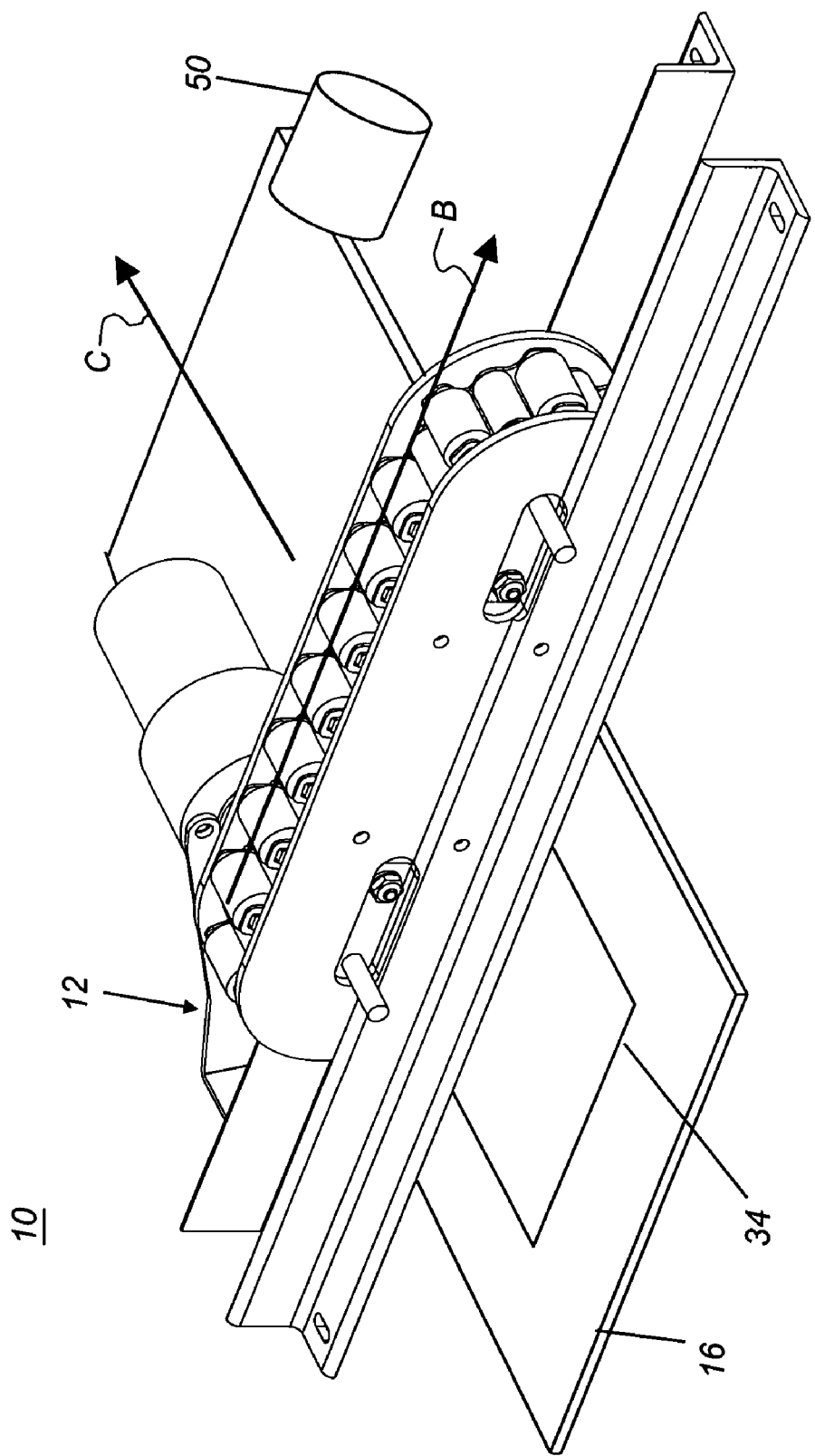
FIG. 8 is a perspective view showing a pressure application apparatus in an alternate embodiment, using a flat platen.

The operation of chained roller assembly 12 in this embodiment is straightforward and allows some measure of flexibility. Each contact roller 36 provides a contact surface that is pressed against platen 16. The dimensional characteristics at the contact area depend, in part, on the overall geometry of platen 16. For the drum embodiment of platen 16 shown in FIGS. 1a, 1b, and 2, the Hertzian contact area of contact roller 36 is generally elliptical in shape, with contact roller 36 and the drum that serves as platen 16 acting as crossed rollers. For an alternate embodiment in which platen 16 is substantially a flat platen, as is shown in FIG. 8, the contact area of contact roller 36 would be along a line. With the non-skewed embodiment of FIG. 1a, this line of contact would be orthogonal to direction B of linked roller chain 24 rotation. With skewed embodiments in which chained roller assembly 12 is skewed (as in FIG. 1b), this line of contact would be offset from orthogonal. Sprockets 30, driven by motor 20, cause this contact area to move in direction B of linked roller chain 24 rotation, thus applying pressure over the surface of a substrate that is placed between chained roller assembly 12 and platen 16.

As the contact area of each contact roller 36 moves over the surface of the substrate in the direction of linked roller chain 24 rotation B, the substrate itself must be moved beneath chained roller assembly 12, where this movement is in a direction that is substantially orthogonal to rotation direction B. In the embodiment shown in FIG. 1a, motor 50 is used to rotate the drum or other surface serving as platen 16 and holding the substrate. In the embodiments of FIGS. 1b and 1c, use of a slight skew angle with the rotation mechanism provides a sufficient force vector orthogonal to rotation direction B to effect movement of the substrate. As is readily apparent from the description of roller assembly 12 given above, the amount of offset between directions B and A (for the FIG. 1b embodiment) or skew K and direction B (for the FIG. 1c embodiment) is a factor in determining the relative rate at which the substrate moves beneath chained roller assembly 12 along platen 16.

Referring to FIG. 8, there is shown another alternate embodiment of pressure application apparatus 10 in which platen 16 is a flat surface or platen. In a preferred embodiment, this flat surface is a slide, allowing movement of sheet 34 of substrate in a direction C that is substantially orthogonal to the direction of linked roller chain 24 rotation B. Here again, however, it is instructive to note that the direction B of linked roller chain 24 rotation may be skewed somewhat, so that the angle between directions B and C is offset from 90 degrees. As is shown with respect to the rotatable drum shown as platen 16 in FIG. 1b, the use of a skew angle can provide the necessary force for slide movement with the FIG. 8 embodiment using a flat slide as platen 16. As was stated with reference to skew angle for embodiments of FIGS. 1b and 1c, the amount of offset used determines the relative rate at which substrate sheet 34 moves in direction C. Alternately, an optional motor 50 (shown in phantom in FIG. 8) could be used to urge platen 16 in direction C. Wherein motor 50 is coupled to platen 16, no skew angle of chained roller assembly 12 would be needed.

Where a separate motor is used for moving platen 16, such as motor 50 in the FIG. 1a embodiment, the relative speed of the motor determines how thoroughly the surface of substrate sheet 34 is subjected to pressure. Clearly, the slower the motor speed, the more thorough the coverage.

Figure 9:
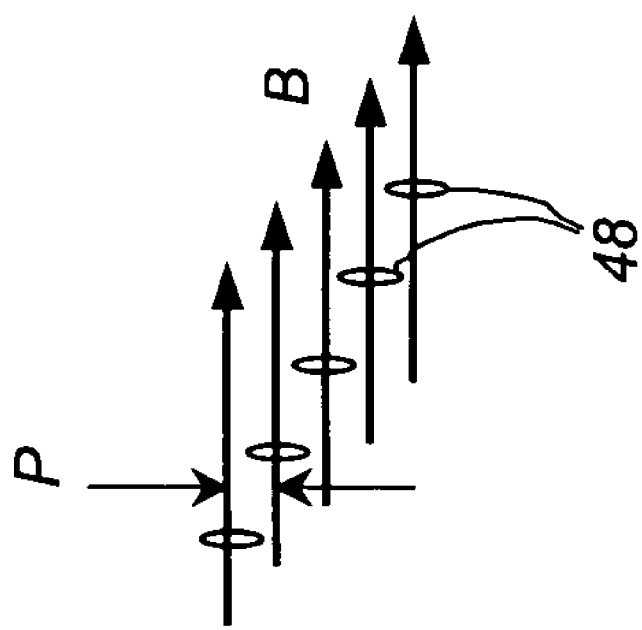
FIG. 9 is a top view showing, in exaggerated form, the pattern of paths traveled by successive links of the roller chain along the substrate.

Referring to the top view of FIG. 9, there is shown, exaggerated significantly and enlarged for the sake of description, how the tracking pattern for contact rollers 36 runs across the surface of substrate sheet 34 when a skew angle is used, such as with the FIGS. 1b and 1c embodiments. Each contact roller 36 has a corresponding contact area 48 that it presses against substrate sheet 34 and moves along the surface of substrate sheet 34 as linked roller chain 24 rotates in direction B. As is represented in FIG. 9, there is some overlap between contact areas 48, along the vertical direction as FIG. 9 is viewed. This means that the same point on the surface of substrate sheet 34 effectively undergoes this moving contact pressure two or more times as substrate sheet 34 passes between chained roller assembly 12 and platen 16. The pitch P between contact areas 48 is a function of the offset angle by which rotation direction B is effectively skewed relative to drum axis A (FIG. 1b), or by which link components 26 are skewed (FIG. 1c). One benefit of the capability to adjust skew angle is an improvement in uniformity, since differences in contact pressure from one link component 26 to the next are averaged for each point on the surface of substrate sheet 34.

Depending on the substrate type and dimensions, various arrangements could be used for coupling sheet 34 of substrate to platen 16. This may be necessary due to a tendency of chained roller assembly 12 to urge sheet 34 along its direction of motion B in some configurations. In one embodiment, platen 16 is a grooved cylinder having a recessed area for securing sheet 34 of substrate in place at its edges, with respect to the B direction. Sheet 34 can be held in place using adhesive tape or other adhesive means, or using fasteners, clamps, or vacuum for example.

It can be appreciated that chained roller assembly 12 is capable of providing, at any instant, a very high compressive force over the contact area of contact roller 36. Moreover, as linked roller chain 24 rotates, essentially the same level of compressive force is applied, thus providing a highly uniform effective pressure onto the substrate, such as would be useful as a crushing force for microencapsulated colorants, for example.

The present invention provides an apparatus and method for applying a uniform pressure over the surface of a substrate. While pressure application apparatus 10 is described for use with an imaging substrate, this apparatus could alternately be applied for other substrate types or for other processes requiring high pressure over a surface, such as lamination. Significantly, pressure application apparatus 10 is scalable in size. For example, by adding link components 26 and by extending the length of support member 32, pressure application apparatus 10 can be sized to handle a dimensionally larger substrate sheet 34. The overall dimensions of link components 26 can be sized to be suitable for characteristics of substrate sheet 34 or of platen 16.

Alternate Embodiment Using Small-Diameter Contact Members

Figure 10:
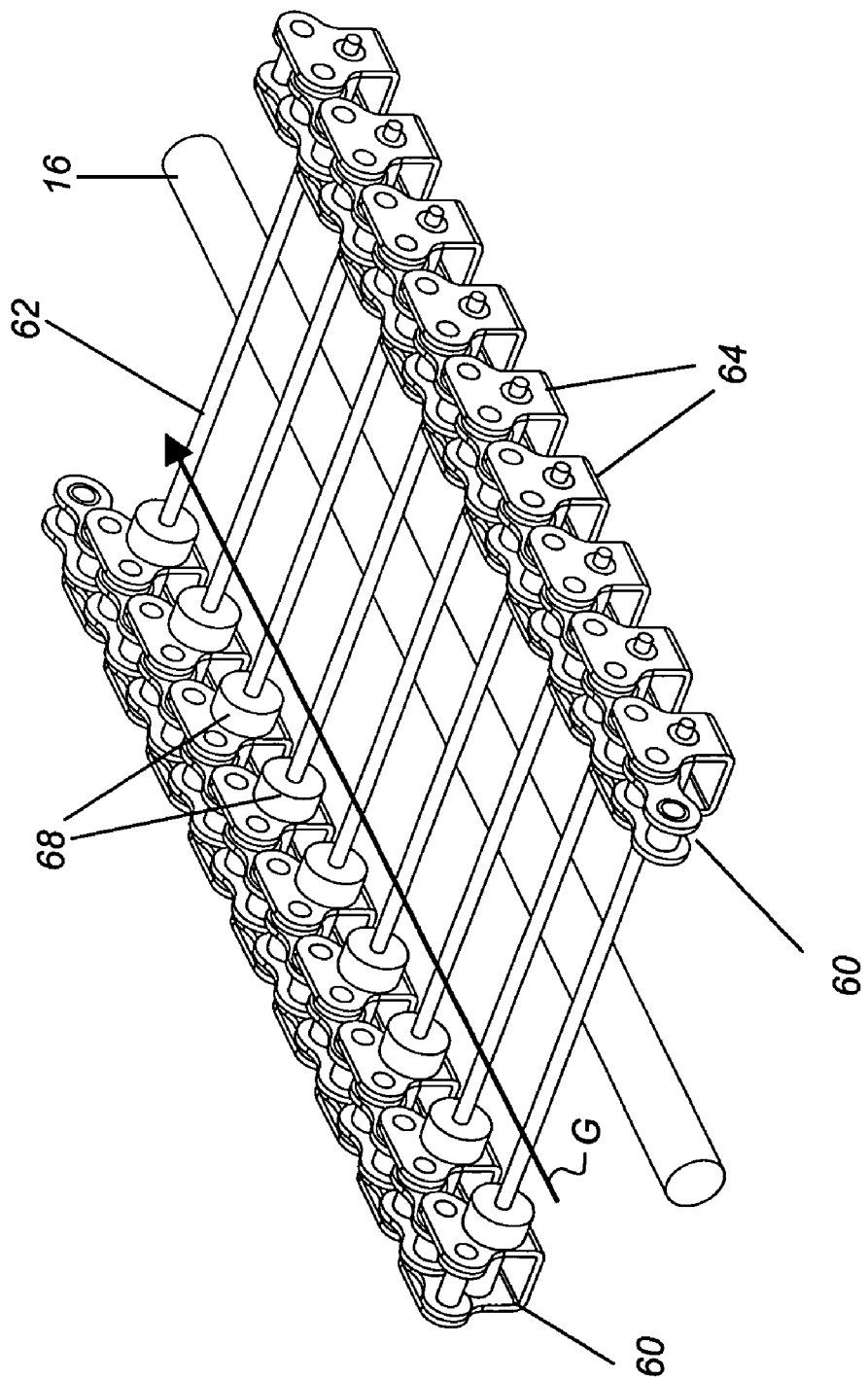
FIG. 10 is a perspective view of a pressure application apparatus in an alternate embodiment, using a dual chain arrangement.
Figure 11:
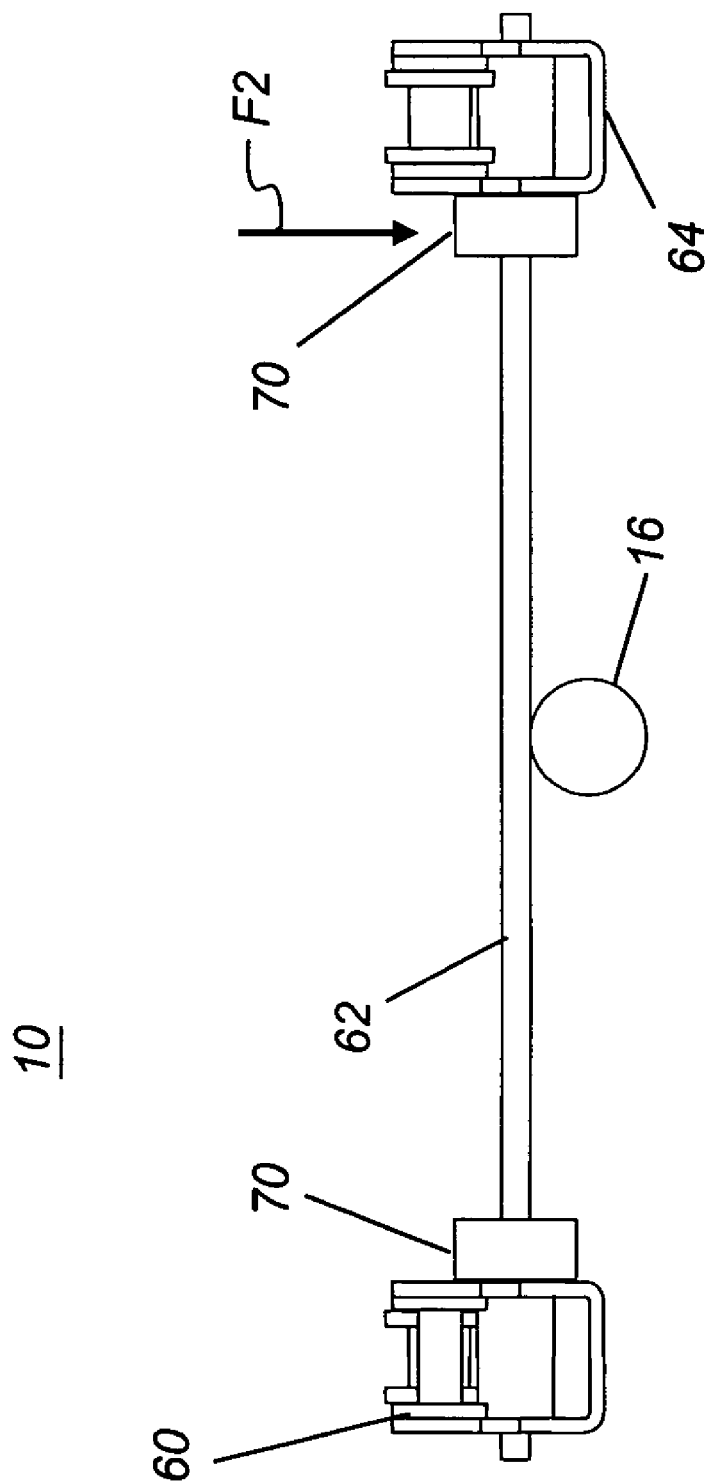
FIG. 11 is a front view of the dual chain arrangement of FIG. 10.

Other embodiments of the present invention employ the same basic principle, applying continuously moving contact members, in a linked series, in compressive contact against a sheet of substrate supported against a platen. Referring now to the perspective view of FIG. 10 and front view of FIG. 11, there is shown an alternate embodiment of a portion of pressure application apparatus 10 using small diameter wires 62 as contact members. With this arrangement, two chain sections 60 are rotated in order to move wires 62 in a direction G, with multiple wires 62 moved and maintained in simultaneous compressive contact against platen 16. In operation, substrate sheet 34 (not shown in FIG. 10 or 11) is placed between wires 62 and platen 16. Chain sections 60 can be fabricated from conventional links, with added brackets 64 clipped on to provide bearings for each wire 62 and wheels 68.

Compressive contact is provided using the inherent spring force of wires 62. Wheels 68 rotate against a support surface 70, which effectively provides a downward force F2 against each chain section 60, bending wire 62 slightly and resulting in spring action. Support surfaces 70 thus keep wires 62 in flexure against platen 16 as wires 62 move along in direction G. The apparatus of this embodiment provides a highly uniform pressure against platen 16 and is capable of higher processing speeds than are available using single-point pressure sources, such as those conventionally available for Cycolor printing media, for example. Wires 62 may be fabricated from steel or other metal that provides sufficient spring force under flexure. Wires 62 themselves serve as contact members in the embodiment of FIGS. 10 and 11; however, wires 62 could alternately serve as axles for rotatable bushings that serve as contact members.

The invention has been described in detail with particular reference to certain preferred embodiments thereof, but it will be understood that variations and modifications can be effected within the scope of the invention as described above, and as noted in the appended claims, by a person of ordinary skill in the art without departing from the scope of the invention. For example, while contact roller 36 is a cylindrical contact member as shown in FIGS. 6 and 7, some variation of the contact surface could be appropriate, such as using a convex shape to yield a smaller effective contact area. A linked series of partially encased ball bearings or other suitable mechanisms could be used as contact members. Contact surfaces are preferably metal, but can be fabricated from other materials suitable for the application. Any of a number of types of motor 20 could be used for rotating linked roller chain 24 (FIGS. 1a –5 and 9) or chain sections 60 (FIGS. 10 and 11) or other linked series of contact members. Similarly, use of motor 50 for moving platen 16 admits a wide range of types. Where some amount of skew angle is provided, a manual embodiment, in which rotational power would be provided by turning a crank or handle, could even be useful, particularly for small-format substrate sizes. Various mounting arrangements could be employed for positioning contact members in compressive contact with platen 16 and maintaining compressive contact, using techniques well known in the mechanical arts. Support member 32, surface 70, or other support mechanism could have any number of mechanical arrangements, provided that a facing surface S is provided to oppose the spring force F, as was shown in FIG. 5. With the dual-chain arrangement of FIGS. 10 and 11, support surface 70 may be embodied using one or more suitable components positioned appropriately for providing force F2 onto wires 62. The support mechanism could provide some measure of adjustability, such as for relative height, for example. This would allow variable pressure application over a range of settings, for example.

In the above description, the term "cylindrical" has been used to describe the shape of platen 16 or of contact roller 36 or other types of contact members in various embodiments. It must be noted that the familiar right circular cylinder, with circular bases with a central axis perpendicular to these bases, is the most familiar type of cylindrical body; however, the right circular cylinder is only one type of cylinder. Other types of cylinders could be used for platen 16 or contact roller 36 or other contact member, including non-circular cylinders (whose bases have closed shapes that are other than circular) and oblique cylinders (whose axis is not perpendicular to the bases).

The drive apparatus also admits a number of possible embodiments, based on how the closed loop having the linked series of contact members is arranged. For linked roller chain 24 of FIG. 3, one or more of sprockets 30 may be mounted on, or mounted separately from, support member 32. In an alternate embodiment, the linked series of contact members is provided by a belt or, for the embodiment of FIGS. 10 and 11 by a pair of belts, each belt rotated by a drive wheel or other suitable mechanism.

It can be appreciated that the apparatus of the present invention has advantages over the conventional arrangement using opposing rollers, as described in the background section above, particularly for applying pressure over larger areas. The apparatus of the present invention is also advantaged over pressure application apparatus using reciprocating pressure points. Chained roller assembly 12 or chained sections 60 with wires 62 could be used in combination with a heated platen 16 in applications requiring both heat energy and compressive force.

The particular embodiment of pressure application apparatus 10 described hereinabove is adapted particularly for use in processing Cycolor imaging media or other types of sheet substrates. However, it must be emphasized that pressure application apparatus 10 may be more broadly adapted to a number of alternate uses, including applications not using a substrate in sheet form. For example, pressure application apparatus 10, suitably sized, could be used in place of a conventional paired-roller device for crushing various types of particulate material.

Thus, what is provided is an apparatus and method using a linked series of contact members for applying pressure against a platen.

PARTS LIST 10 pressure application apparatus
12 chained roller assembly
14 mounting bracket
16 platen
18 base
20 motor
22 motor bracket
24 linked roller chain
26 link component
28 guide plates
30 sprocket 32 support member
34 sheet
36 contact roller
38 transmission roller
40 side plate
42 bushing
44 spring mounted bearing
46 pin
48 contact area
50 motor
60 chain section
62 wire
64 bracket
68 wheel
70 surface

What is claimed is:

1. An apparatus for applying pressure against a platen, comprising:
   a linked series of contact members arranged in a closed loop;
   a drive apparatus for rotating the loop about a support mechanism, thereby imparting movement in a first direction to the linked series of contact members;
   the support mechanism disposed to force a plurality of the moving contact members simultaneously into compressive contact against at least a portion of the platen;
   wherein the platen is cylindrical and rotates causing movement of a surface of said platen in a second direction; and
   wherein movement of said closed loop is transverse to the movement of said surface of said cylindrical platen.

2. An apparatus for applying pressure according to claim 1 wherein the linked series of contact members comprises a plurality of roller links.

3. An apparatus for applying pressure according to claim 1 wherein the contact member is substantially cylindrical.

4. An apparatus for applying pressure according to claim 1 wherein the contact member is circumferentially rotatable about an axis.

5. An apparatus for applying pressure according to claim 1 wherein the closed loop rotates in a travel direction that is at a non-zero offset angle with respect to the axis of the cylindrical platen.

6. An apparatus for applying pressure according to claim 1 wherein the drive apparatus comprises at least one sprocket.

7. An apparatus for applying pressure according to claim 1 wherein the drive apparatus comprises a motor.

8. An apparatus for applying pressure according to claim 1 wherein the drive apparatus is manually operable.

9. An apparatus for applying pressure according to claim 1 wherein the drive apparatus comprises a pair of sprockets.

10. An apparatus for applying pressure according to claim 1 wherein a sheet of substrate is wrapped onto the cylindrical platen.

11. An apparatus for applying pressure according to claim 1 wherein spring force is applied to each contact member.

12. An apparatus for applying pressure according to claim 1 further comprising a motor for rotating the platen.

13. An apparatus for applying pressure according to claim 1 wherein the linked series of contact members rotates in a travel direction and the axis of each contact member is other than orthogonal relative to the travel direction.

14. An apparatus for applying pressure according to claim 1 further comprising a transmission roller associated with at least one of the contact members for mechanical coupling with the drive apparatus.

15. An apparatus for applying pressure according to claim 1 further comprising at least one guide plate for maintaining the rotational motion of the closed loop in a predetermined direction.

16. An apparatus for applying pressure according to claim 1 wherein the platen is heated.

17. An apparatus for applying pressure according to claim 1 wherein the contact members are substantially spherical.

18. An apparatus for applying pressure according to claim 1 wherein at least one contact member is a wire.

19. An apparatus for applying pressure according to claim 1 wherein the position of the support mechanism is adjustable.

20. An apparatus for applying pressure onto a sheet of substrate supported against a platen, comprising:
    a linked series of contact members arranged in a closed loop;
    a drive apparatus for rotating the loop about a support mechanism, thereby imparting movement in a first direction to the linked series of contact members;
    the support mechanism disposed to force a plurality of the moving contact members simultaneously into compressive contact against at least a portion of the sheet of substrate that is supported against the platen;
    wherein the platen is cylindrical and rotates causing movement of a surface of said platen in a second direction; and
    wherein movement of said closed loop is transverse to the movement of said surface of said cylindrical platen.

21. An apparatus for applying pressure according to claim 20 wherein the linked series of contact members comprises a plurality of roller links.

22. An apparatus for applying pressure according to claim 20 wherein the contact member is substantially cylindrical.

23. An apparatus for applying pressure according to claim 20 wherein the contact member is circumferentially rotatable about an axis.

24. An apparatus for applying pressure according to claim 20 wherein the closed loop rotates in a travel direction that is at a non-zero offset angle with respect to the axis of the cylindrical platen.

25. An apparatus for applying pressure according to claim 20 wherein the drive apparatus comprises at least one sprocket.

26. An apparatus for applying pressure according to claim 20 wherein the drive apparatus comprises a motor.

27. An apparatus for applying pressure according to claim 20 wherein the drive apparatus is manually operable.

28. An apparatus for applying pressure according to claim 20 wherein the substrate is wrapped onto the cylindrical platen.

29. An apparatus for applying pressure according to claim 20 wherein the drive apparatus comprises a pair of sprockets.

30. An apparatus for applying pressure according to claim 20 wherein the sheet of substrate is wrapped onto the cylindrical platen.

31. An apparatus for applying pressure according to claim 20 wherein spring force is applied to each contact member.

32. An apparatus for applying pressure according to claim 20 further comprising a motor for rotating the platen.

33. An apparatus for applying pressure according to claim 20 wherein the linked series of contact members rotates in a travel direction and the axis of each contact member is other than orthogonal relative to the travel direction.

34. An apparatus for applying pressure according to claim 20 further comprising a transmission roller associated with at least one of the contact members for mechanical coupling with the drive apparatus.

35. An apparatus for applying pressure according to claim 20 further comprising at least one guide plate for maintaining the rotational motion of the closed loop in a predetermined direction.

36. An apparatus for applying pressure according to claim 20 wherein the platen is heated.

37. An apparatus for applying pressure according to claim 20 wherein the contact members are substantially spherical.

38. An apparatus for applying pressure according to claim 20 wherein at least one contact member is a wire.

39. An apparatus for applying pressure according to claim 20 wherein the position of the support mechanism is adjustable.

40. An apparatus for applying pressure onto a sheet of substrate, comprising:
   a linked chain comprising a plurality of contact member links, each contact member link comprising at least one contact member;
   a drive apparatus for rotating the linked chain about a support mechanism in a first direction;
   the support mechanism disposed to force a plurality of the moving contact members simultaneously into compressive contact against the sheet of substrate that is supported against a platen;
   wherein the platen is substantially cylindrical and rotates causing movement of a surface of said platen in a second direction; and
   wherein movement of said closed loop is transverse to the movement of said surface of said cylindrical platen.

41. An apparatus for applying pressure according to claim 40 wherein the contact member is substantially cylindrical.

42. An apparatus for applying pressure according to claim 40 wherein the contact member is circumferentially rotatable about an axis.

43. An apparatus for applying pressure according to claim 40 wherein the linked chain rotates in a travel direction that is at a non-zero offset angle with respect to the axis of the cylindrical platen.

44. An apparatus for applying pressure according to claim 40 wherein the drive apparatus comprises a sprocket.

45. An apparatus for applying pressure according to claim 40 wherein the drive apparatus comprises a motor.

46. An apparatus for applying pressure according to claim 40 wherein the drive apparatus is manually operable.

47. An apparatus for applying pressure according to claim 40 wherein the substrate is wrapped onto the cylindrical platen.

48. An apparatus for applying pressure according to claim 40 wherein the drive apparatus comprises a pair of sprockets.

49. An apparatus for applying pressure according to claim 40 wherein spring force is applied to each contact member.

50. An apparatus for applying pressure according to claim 40 further comprising a motor for rotating the platen.

51. An apparatus for applying pressure according to claim 40 wherein the linked chain rotates in a travel direction and the axis of each contact member is other than orthogonal relative to the travel direction.

52. An apparatus for applying pressure according to claim 40 further comprising a transmission roller link associated with at least one of the contact members for mechanical coupling with the drive apparatus.

53. An apparatus for applying pressure according to claim 40 further comprising at least one guide plate for maintaining the rotational motion of the linked chain in a predetermined direction.

54. An apparatus for applying pressure according to claim 40 wherein the platen is heated.

55. An apparatus for applying pressure according to claim 40 wherein the contact members are substantially spherical.

56. An apparatus for applying pressure according to claim 40 wherein the sheet of substrate is held in place against the platen by vacuum force.

57. A method for applying pressure onto a sheet of substrate, comprising:
   (a) forming a linked series of contact members arranged in a closed loop;
   (b) disposing a support mechanism to force a plurality of contact members simultaneously into compressive contact against the sheet of substrate that is supported against a platen;
   (c) rotating the loop about the support mechanism, imparting movement to the linked series of contact members and pressing a moving series of contact members against the sheet of substrate thereby; and
   wherein the platen is cylindrical about a platen axis and wherein the step of disposing the support mechanism comprises the step of orienting the direction of loop rotation at a non-zero offset angle relative to the platen axis.

58. A method for applying pressure according to claim 57 wherein the step of rotating the loop comprises the step of activating a motor.

59. A method for applying pressure according to claim 57 wherein the step of rotating the loop comprises the step of rotating a mechanical member.

60. A method for applying pressure according to claim 57 wherein the step of forming a linked series of contact members comprises the step of adjusting a contact member axis for each contact member to be other than orthogonal relative to the platen axis.

61. A method for applying pressure according to claim 57 further comprising the step of coupling the sheet of substrate to the platen.

62. A method for applying pressure according to claim 61 wherein the step of coupling the sheet of substrate to the platen comprises the step of adhering the sheet of substrate to a cylindrical drum.

63. A method for applying pressure according to claim 61 wherein the step of coupling the sheet of substrate to the platen comprises the step of applying a vacuum.

64. A method for applying pressure according to claim 61 wherein the step of coupling the sheet of substrate to the platen comprises the step of applying a clamp.

65. A method for applying pressure onto a sheet of substrate, comprising:
   (a) forming a linked chain comprising a plurality of roller links, each roller link comprising a contact member, wherein the contact member is circumferentially rotatable about a first axis;
   (b) rotating the linked chain, in a travel direction, about a support member;
   (c) mounting the support member to force a plurality of roller links into compressive contact with the sheet of substrate, compressing the sheet of substrate against a platen thereby; and
   wherein the platen is cylindrical about a second axis and wherein the step of mounting the support member comprises the step of orienting the travel direction at a non-zero offset angle relative to the second axis.

66. A method for applying pressure according to claim 65 wherein the step of rotating the linked chain comprises the step of activating a motor.

67. A method for applying pressure according to claim 65 wherein the step of rotating the linked chain comprises the step of rotating a mechanical member.

68. A method for applying pressure according to claim 65 wherein the step of forming a linked chain comprises the step of adjusting the first axis to be other than orthogonal relative to the travel direction.

69. A method for applying pressure according to claim 65 further comprising the step of coupling the sheet of substrate to the platen.

70. A method for applying pressure according to claim 69 wherein the step of coupling the sheet of substrate to the platen comprises the step of adhering the sheet of substrate to a cylindrical drum.

71. A method for applying pressure according to claim 69 wherein the step of coupling the sheet of substrate to the platen comprises the step of applying a vacuum.

72. A method for applying pressure according to claim 69 wherein the step of coupling the sheet of substrate to the platen comprises the step of applying a clamp.

73. A method for applying pressure against a platen, comprising:
 (a) arranging a linked series of contact members in a closed loop;
 (b) disposing a support mechanism to force a plurality of the contact members simultaneously into compressive contact against the platen; and
 (c) rotating the loop about the support mechanism, imparting movement in a first direction to the linked series of contact members and pressing a moving series of contact members against the platen; and
 (d) wherein the contact members moves in a direction transverse to a movement of the contact members in a second direction.

74. A method for applying pressure according to claim 73 wherein rotation of the loop causes movement of the substrate relative to the contract members.

* * * * *